(12) United States Patent
Zhou et al.

(10) Patent No.: US 12,219,866 B2
(45) Date of Patent: Feb. 4, 2025

(54) FLEXIBLE OLED DISPLAY DEVICE

(71) Applicant: BOE TECHNOLOGY GROUP CO., LTD., Beijing (CN)

(72) Inventors: Yonghong Zhou, Beijing (CN); Shiming Shi, Beijing (CN); Meiling Gao, Beijing (CN); Zhao Li, Beijing (CN); Liming Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 606 days.

(21) Appl. No.: 17/422,608

(22) PCT Filed: Jan. 4, 2021

(86) PCT No.: PCT/CN2021/070090
§ 371 (c)(1),
(2) Date: Jul. 13, 2021

(87) PCT Pub. No.: WO2021/147654
PCT Pub. Date: Jul. 29, 2021

(65) Prior Publication Data
US 2022/0344602 A1    Oct. 27, 2022

(30) Foreign Application Priority Data
Jan. 22, 2020  (CN) .......................... 202010075992.X

(51) Int. Cl.
*H01L 51/00* (2006.01)
*H01L 51/56* (2006.01)
(Continued)

(52) U.S. Cl.
CPC .......... *H10K 77/111* (2023.02); *H10K 71/00* (2023.02); *H10K 2102/311* (2023.02); *H10K 2102/351* (2023.02)

(58) Field of Classification Search
None
See application file for complete search history.

(56) References Cited

U.S. PATENT DOCUMENTS

2014/0217382 A1 * 8/2014 Kwon ................ H10K 50/8426
257/40
2014/0355195 A1 12/2014 Kee et al.
(Continued)

FOREIGN PATENT DOCUMENTS

| CN | 108806508 A | 11/2018 |
| CN | 108962035 A | 12/2018 |

(Continued)

OTHER PUBLICATIONS

International Search Report received for PCT Patent Application No. PCT/CN2021/070090, mailed on Mar. 26, 2021, 6 pages (2 pages of English Translation and 4 pages of Original Document).

*Primary Examiner* — Robert K Carpenter
(74) *Attorney, Agent, or Firm* — Calfee, Halter & Griswold LLP

(57) ABSTRACT

A flexible OLED display device includes a flexible display panel and a support member. The flexible display panel includes an active area, an extension portion and a bending portion connecting the active area and the extension portion. The support member is located between the active area and the extension portion. The active area, the support member and the extension portion are stacked, and a predetermined distance is set between the support member and the bending portion in an extending direction parallel to the extension portion.

13 Claims, 2 Drawing Sheets

(51) Int. Cl.
*H10K 71/00* (2023.01)
*H10K 77/10* (2023.01)
*H10K 102/00* (2023.01)

(56) References Cited

U.S. PATENT DOCUMENTS

| | | | |
|---|---|---|---|
| 2017/0117346 A1* | 4/2017 | Kim | H01L 23/49861 |
| 2019/0051858 A1* | 2/2019 | Tomioka | H10K 59/124 |
| 2019/0340959 A1* | 11/2019 | Park | H10K 71/00 |
| 2019/0372033 A1 | 12/2019 | Li | |
| 2021/0084778 A1 | 3/2021 | Zhou et al. | |
| 2021/0120688 A1 | 4/2021 | Wang | |

FOREIGN PATENT DOCUMENTS

| | | |
|---|---|---|
| CN | 208806014 U | 4/2019 |
| CN | 109859642 A | 6/2019 |
| CN | 111128034 A | 5/2020 |
| KR | 10-2018-0111281 A | 10/2018 |

\* cited by examiner

FLEXIBLE OLED DISPLAY DEVICE

CROSS REFERENCE TO RELATED APPLICATIONS

The present application is a 35 U.S.C. 371 national stage application of a PCT International Application No. PCT/CN2021/070090, filed on Jan. 4, 2021, which claims the priority of a Chinese Patent Application No. 202010075992.X, filed on Jan. 22, 2020, the contents of which are incorporated herein by reference in their entireties.

TECHNICAL FIELD

The present disclosure relates generally to the technical field of display, in particular to the technical field of flexible display devices, and more particularly to a flexible OLED display device.

BACKGROUND

Intelligence, portability, and flexibility are main development directions of electronic devices at present. Flexible display is a hot technical direction in recent years. For example, electronic paper, organic light-emitting diode (OLED) and reflective liquid crystal and the like can have the opportunities to realize flexible display screen. A flexible display panel is a deformable and bendable display panel made of flexible materials. OLED display panel is a display panel made of organic light emitting diodes.

OLED display panel has attracted more and more attention and acceptance because it is light and thin (without backlight), its image display has high brightness, high definition, and it has the characteristics of deformability and bendability (i.e., flexibility), energy saving and the like, especially the outstanding characteristic of flexibility. At present, more and more electronic devices adopt OLED flexible display panels. In particular, AMOLED (Active Matrix Organic Light Emitting Diode) is more conducive to making thinner and more flexible devices, and has the advantages of active light emission, good display effect and high contrast, which is also the most promising in flexible display technology.

With the development of flexible display screen, people have more and more high expectations for foldable display products. For example, the bendable radius of flexible AMOLED is getting smaller and smaller, so there is an opportunity to realize foldable AMOLED display. With the smaller and smaller bendable radii of foldable display products, the difference between inner radius and outer radius of the foldable display product during folding and unfolding is getting bigger and bigger, which requires the foldable display products to have better elasticity in order to relieve the stress generated during folding and unfolding.

At present, although the foldable products on the market have certain elasticity, with the gradual reduction of the foldable radius (curvature radius) of the foldable product, the stress cannot be completely relieved during folding and unfolding. As a result, the stress that cannot be completely relieved during folding and unfolding process causes certain damage to the display products.

Therefore, it is necessary to provide an improved display device which can effectively relieve stress.

SUMMARY

In view of the above defects or deficiencies in the related art, it is desirable to provide an improved flexible display device to effectively relieve stress.

The present disclosure provides a flexible OLED display device, including:

a flexible display panel comprising an active area, an extension portion and a bending portion connecting the active area and the extension portion; and a support member positioned between the active area and the extension portion;

wherein the active area, the support member and the extension portion are stacked, and a predetermined distance is set between the support member and the bending portion in an extending direction parallel to the extension portion.

According to an aspect of the present disclosure, the predetermined distance is determined by the following relationship:

$$x \geq (T_{bond}^2 + T_{oled}^2 + T_{support\ member}^2)^{1/2} + \Delta;$$

wherein x is the predetermined distance; $T_{bond}$ is a bond tolerance between the flexible display panel and the support member in the extending direction parallel to the extension portion, $T_{oled}$ is a dimensional tolerance of the flexible display panel in the extending direction parallel to the extension portion, and $T_{support\ member}$ is a dimensional tolerance of the support member in the extending direction parallel to the extension portion; $\Delta$ is an amount of displacement of the support member relative to the flexible display panel in the extending direction parallel to the extension portion when the flexible display panel is folded.

According to an aspect of the present disclosure, the predetermined distance is 0.2 mm~1 mm.

According to an aspect of the present disclosure, the flexible display device further includes a first laminated structure and a second laminated structure, wherein the first laminated structure is configured to adhere a first surface of the support member to the active area, and the second laminated structure is configured to adhere a second surface of the support member to the extension portion, the first surface of the support member being opposite to the second surface.

According to an aspect of the present disclosure, the first laminated structure comprises:

a first film which is bonded to a side of the flexible display panel facing the support member and terminates at the bending portion;

a second film, which is bonded to a side of the first film facing the support member and terminates at the bending portion;

a first connecting structure arranged at a side of the support member facing the active area.

According to an aspect of the present disclosure, the second laminated structure comprises:

a first film which is bonded to a side of the flexible display panel facing the support member and terminates at the bending portion; a second film which is bonded to a side of the first film facing the support member and terminates at the bending portion; and a second connecting structure arranged at a side of the support member facing the extension portion, wherein the support member is bonded and connected with the second film of the first laminated structure and the second film of the second laminated structure through the first connecting structure and the second connecting structure respectively.

According to an aspect of the present disclosure, a distance y is set between an end of the second connecting structure close to the bending portion and an end B of the bending portion connecting the extension portion in the extending direction parallel to the extension portion.

According to an aspect of the present disclosure, the distance y is 0.1 mm~2 mm.

According to an aspect of the present disclosure, a side of the bending portion facing away from the support member is coated with curable adhesive.

According to an aspect of the present disclosure, the curable adhesive extends beyond the bending portion and at least partially covers the extension portion.

According to an aspect of the present disclosure, in the extending direction parallel to the extension portion, the length of the extension portion coated with the curable adhesive is 0.3 mm~2 mm.

According to an aspect of the present disclosure, the first connecting structure and the second connecting structure are both double-sided adhesive tapes. The first film comprises any one of the following: double-sided adhesive tape, polyimide, polyester resin or metal film. The second film comprises any one of the following: double-sided adhesive tape, polyimide, polyester resin or metal film. The material of the support member comprises any one of the following materials: plastic, nylon glass fiber, stainless steel, aluminum alloy, copper alloy, titanium alloy, rubber or foam.

According to another aspect of the present disclosure, the first film in the first laminated structure is connected with the flexible display panel by a first film adhesive, and the second film in the first laminated structure is connected with the first film in the first laminated structure by a second film adhesive.

According to yet another aspect of the present disclosure, the first connecting structure and the second connecting structure are both double-sided adhesive tapes, and a adhesive strength of the first connecting structure is greater than that of the first film adhesive and also greater than that of the second film adhesive.

BRIEF DESCRIPTION OF THE DRAWINGS

Other features, objects and advantages of the present disclosure will become more apparent by reading the detailed description of non-limiting exemplary embodiments made with reference to the following drawings.

DETAILED DESCRIPTION

Figure 1:
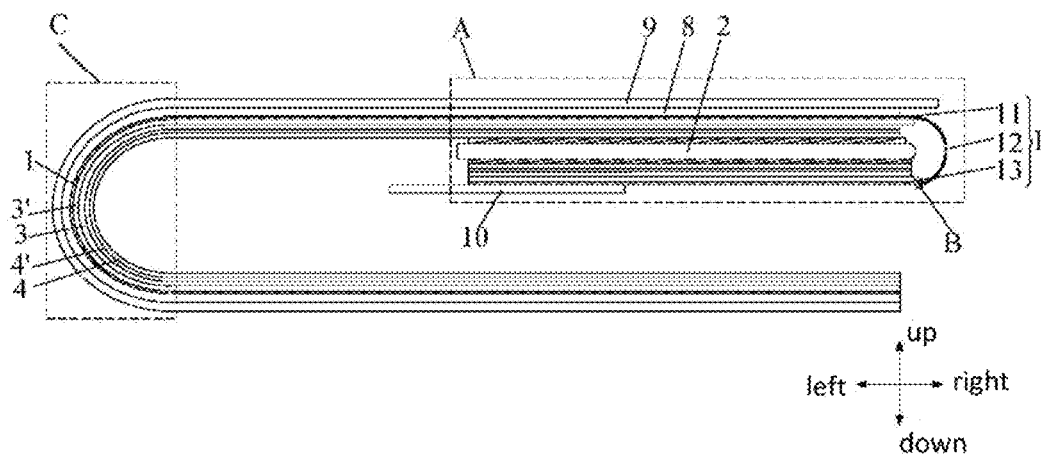
FIG. 1 is a schematic diagram of an overall structure of a flexible display device provided by some exemplary embodiments of the present disclosure.

The following is a further detailed description of this disclosure with reference to the drawings and embodiments. It can be understood that the specific embodiments described herein are only used to explain the disclosure, and not to limit the disclosure. In addition, for convenience of description, only the parts related to disclosure are shown in the drawings.

It should be noted that the various features and elements in the embodiments of the present disclosure can be combined with each other without conflict. Hereinafter, the present disclosure will be described in detail with reference to the drawings and in conjunction with embodiments.

With reference to FIG. 1-FIG. 6, first, the general inventive concept and idea of this disclosure are briefly described.

According to some exemplary embodiments of the present disclosure, a side (e.g., a right side in FIGS. 1-2 and 4-5) of an edge region of the 1o bendable flexible display panel 1 is bent from a display side (e.g., an upper side in FIGS. 2 and 5) to a back side opposite to the display side (e.g., a lower side in FIGS. 2 and 5), thereby forming a substantially semicircular bending portion 12 (also called pad bending area) at a side (e.g., an upper right side in FIGS. 2 and 5) of the edge region of the flexible display screen and forming an extension portion 13 at the back side opposite to the display side. An end of the bending portion 12 is connected with the active area 11 and integrated with it, and the other end of the bending portion 12 is connected with the extension portion 13 and integrated with it. In FIGS. 1-6, the end region of the bending portion 12 connected with the extension portion 13 is marked with a reference numeral B, which is hereinafter referred to as region B or point B. The bending portion 12 and the extension portion 13 are usually used as non-active area of the flexible display panel 1, and there are usually many wires in the bending portion 12 and the extension portion 13 to connect with a driver IC for driving the flexible display panel 1 to operate, or to connect with FPC (Flexible Printed Circuit) for connecting the flexible display panel 1 with other elements of the flexible display device. When the flexible display panel 1 is bent, because the bending radius of each layer is different, displacement will occur between the layers, so the wires in the pad bending area might be damaged by poking, disconnected or short-circuited.

Through experiments, the inventor of the present disclosure found that by forming a supporting area between the active area (AA for abbreviation, which refers an area capable of displaying texts, graphics, and images) 11 of the flexible display panel 1, and the bending portion 12 and the extension portion 13 which serve as the non-active area of the flexible display panel 1, and arranging a support member 2 in the supporting area, on one hand, the bending portion 12 can be prevented from being damaged when the flexible display panel 1 is pressed. On the other hand, if a certain gap is set between an end face of the support member 2 (a right end face in FIG. 1) and an inner surface of the bending portion 12, the phenomenon of wire damage caused by poking, open circuit or short circuit in the pad bending area can be effectively alleviated.

The flexible display screen performs actions from unfolding to folding in use. When the flexible display panel 1 is bent, the bending radius of each layer is different, and displacement will occur between various layers.

Through experiments, the inventor of this disclosure found that the gap x between the end face of the support member 2 and the inner surface of the bending portion 12 will gradually decrease with repeated bending-unfolding actions. With the decrease of the gap x, the probability of wire damage caused by poking, open circuit or short circuit in the pad bending area increases accordingly.

Finally, the inventor of the present disclosure optimized the design of the gap x between the end face of the support member 2 and the inner surface of the bending portion 12 through hard work, continuous experiment and simulation research.

According to the flexible display device provided by some exemplary embodiments of the present disclosure, the active area 11 and the extension portion 13 of the flexible display panel 1 are supported by the support member 2, which effectively prevents the bending portion from being compressed and deformed, so that the bending portion is well supported and protected, and a preset safety distance is set between the support member 2 and the bending portion 12, which effectively prevents the support member 2 from damaging the bending portion 12 by poking it when the flexible display panel 1 bends, and effectively alleviates the problem of wire disconnection.

Next, some exemplary embodiments of the present disclosure will be described in more detail with reference to FIGS. 1-6.

Figure 2:
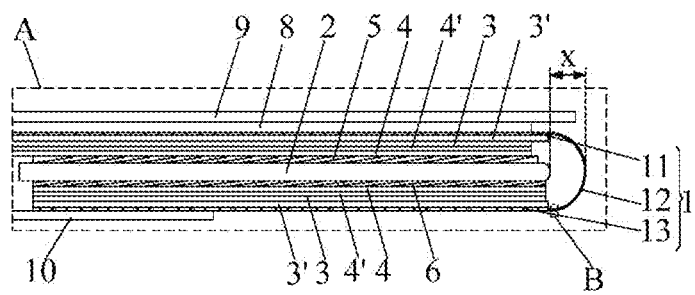
FIG. 2 is an enlarged view of a part A in FIG. 1.

As shown in FIGS. 1 and 2, some exemplary embodiments of the present disclosure provide a flexible OLED display device, which includes a flexible OLED display panel 1 and a support member 2. The flexible display panel 1 includes an active area 11, an extension portion 13, and a bending portion 12 connecting the active area 11 and the extension portion 13 (the bending portion 12 and the extension portion 13 together serve as the non-active area of the flexible display panel 1). The active area 11, the extension portion 13 and the support member 12 are stacked, and the support member 12 is located between the active area 11 and the extension portion 13. In the extending direction parallel to the extension portion 13, there is a distance between the support member 2 and the bending portion 12.

The active area 11 is used for displaying graphics, images and texts. The active area 11 has a front surface (an upper surface in FIGS. 1-2) for presenting images and a back surface (a lower surface in FIGS. 1-2) opposite to the front surface. The extension portion 13 is located at the lower side opposite to the back surface of the active area 11. Wires are arranged in the bending portion 12 and the extension portion 13. The bending portion 12 is the pad bending area.

Four directions "up", "down", "left" and "right" illustrated in FIG. 1 are only used to express relative positional relationships. When the absolute position of the described object changes, the relative positional relationship may also change accordingly. It should be noted that these directional words should not be narrowly interpreted as limiting the protection scope of the flexible display device claimed in this disclosure.

FIG. 1 is a schematic diagram of an overall structure of a flexible display device provided by some exemplary embodiments of the present disclosure. The flexible display panel 1 of the flexible display device in FIG. 1 is folded at C (C is located in the active area 11) to fold the active area 11 of the flexible display panel 1 into an upper half and a lower half, so that the whole structure of the flexible display device is in the folded state, which is convenient for storage in a box, wherein an edge of an end of the upper half of the flexible display panel 1 (the right end of the upper half in FIG. 1) is the bending portion 12 which serves as the non-active area. When the flexible display device needs to be unfolded for large-area display, the flexible display panel 1 of the flexible display device is unfolded at C, so that cooperated display of the upper half and the lower half of the active area 11 can be realized.

A supporting area is formed between the active area 11, the bending portion 12 and the extension portion 13, and a support member 2 supports in the supporting area, so that the bending portion 12 can be prevented from being damaged when the flexible display panel is pressed.

There is a gap between the support member 2 and the bending portion 12. When the flexible display panel is folded, through experiments, the inventor of the disclosure found that the support member 2 moves to the right relative to the active area 11, and causes the gap to become smaller, which might cause wire damage by poking, open circuit or short circuit in the pad bending area. As a further improvement, the inventor of the present disclosure can ensure a certain gap between the support member 2 and the bending portion 12 when the flexible display panel is in the folded state by setting a preset safety distance x between the support member 2 and the bending portion 12, to avoid the bending portion from being damaged by poking, thereby avoiding the occurrence of wire damage or disconnection.

An end of the support member 2 near the bending portion 12 has a rounded structure, which further ensures a gap between the support member 2 and the bending portion 12.

Furthermore, the inventor of this disclosure has made unremitting efforts to optimize the design of the preset safety distance x between the support member 2 and the bending portion 12 as follows.

According to some exemplary embodiments of the present disclosure, the preset safety distance can be determined by the following relationship:

$$x \geq (T_{bond}^2 + T_{oled}^2 + T_{support\ member}^2)^{1/2} + \Delta;$$

where x is the preset safety distance; $T_{bond}$ is a bond tolerance of the flexible display panel and the support member in left-right direction (FIG. 1); $T_{oled}$ is a dimensional tolerance of flexible display panel in left-right direction (FIG. 1), and $T_{support\ member}$ is a dimensional tolerance of the support member in left-right direction (FIG. 1); $\Delta$ is an amount of displacement of the support member 2 relative to the flexible display panel in the left-right direction when the flexible display panel 1 is folded.

Optionally, the bending portion 12 is approximately semicircular, an end of the support member 2 is rounded, and the preset safety distance x between a top end of the support member 2 and the bending portion 12 is optionally 0.2 mm~1 mm.

Optionally, x is 0.3 mm, so as to effectively ensure that the support member 2 will not damage the bending portion 12 by poking during bending the flexible display panel 1 from the unfolded state to the folded state.

The material of the support member 2 includes any one of the following: plastic, nylon glass fiber, stainless steel, aluminum alloy, copper alloy, titanium alloy, rubber or foam. In practical application, the material of the support member 2 can be set according to stiffness requirement, material technology, price, and whole thickness requirement of the flexible display device.

Further, as an option, the flexible display device may further include a first laminated structure and a second laminated structure. The first laminated structure is configured to adhere the upper surface of the support member 2 to the back surface of the active area 11. The second laminated structure is configured to adhere the lower surface of the support member 2 to the extension portion 13.

The first laminated structure includes a first film 3, a second film 4 and a first connecting structure 5. The second laminated structure includes a first film 3, a second film 4 and a second connecting structure 6.

The following description will take the first laminated structure as an example.

The first film 3 in the first laminated structure is bonded to a side of the flexible display panel 1 facing the support member 2 and terminates or interrupts at the bending portion 12, and the flexible display panel is supported and protected by the first film 3.

The second film 4 in the first laminated structure is bonded to a side of the first film 3 facing the support member and terminates or interrupts at the bending portion 12, and the second film can increase the resilience of the flexible display panel when the flexible display panel changes from the folded state to the unfolded state.

The first connecting structure 5 in the first laminated structure is arranged at a side of the support member 2 facing the active area 11.

Optionally, the first film 3 in the first laminated structure is connected with the flexible display panel 1 through a first film adhesive 3'; the second film 4 in the first laminated structure and the first film 3 in the first laminated structure are connected by a second film adhesive 4'.

Optionally, the first film 3 in the first laminated structure comprises any one of the following: double-sided adhesive tape, polyimide, polyester resin or metal film. The second film 4 in the first laminated structure includes any one of the following: double-sided adhesive tape, polyimide, polyester resin or metal film. The first film adhesive 3' and the second film adhesive 4' in the first laminated structure are both double-sided adhesive tapes. The first connecting structure 5 is double-sided adhesive tape. The adhesive force (or adhesive strength) of the first connecting structure 5 is greater than the adhesive force (or adhesive strength) of the first film adhesive 3' and the adhesive force (or adhesive strength) of the second film adhesive 4'.

The second laminated structure and the first laminated structure are in mirror symmetry relationship with the support member 2 as a central plane. The corresponding structure of the second laminated structure is similar to that of the first laminated structure, so it will not be described in detail here.

It should be noted that the second connecting structure 6 in the second laminated structure is arranged at a side of the support member 2 facing the extension portion 13. The support member 2 is bonded and connected to the second film 4 of the first laminated structure and the second film 4 of the second laminated structure through the first connecting structure 5 and the second connecting structure 6 respectively. The second connecting structure 6 is double-sided adhesive tape, and its adhesive force (or adhesive strength) is greater than that of the first film adhesive 3' and that of the second film adhesive 4'.

Referring to FIG. 1, the upper side of the support member 2 is connected with the second film 4 by the double-sided adhesive tape. Since the support member 2 and the second film 4 are relatively fixed, the displacement amount of the support member 2 relative to the flexible display panel 1 is about the displacement amount of the second film 4 relative to the flexible display panel 1. Therefore, the displacement amount Δ of the support member 2 with respect to the flexible display panel 1 is:

$$\Delta \approx \pi (1/2 * t_{oled} + t_{first\ film\ adhesive} + t_{first\ film} + t_{second\ film\ adhesive} 1/2 * t_{second\ film})*K,$$

where the thickness of the active area is uniform and consistent with that of the extension portion, $t_{oled}$ represents a thickness of the flexible display panel (or active area, or extension portion), $t_{first\ film\ adhesive}$ represents a thickness of first film adhesive, $t_{second\ film\ adhesive}$ represents a thickness of the second film adhesive, $t_{first\ film}$ represents a thickness of first film, $t_{second\ film}$ represents a thickness of the second film, K is a coefficient, and optionally K is 1~2.5.

The structure between the active area 11, the extension portion 13 and the support member 2 of the flexible display panel 1 is not limited to the above-mentioned first film adhesive 3', first film 3, second film adhesive 4', second film 4, first connecting structure 5 and second connecting structure 6, and additional film layers can be added to protect the active area and the extension portion.

Figure 3:
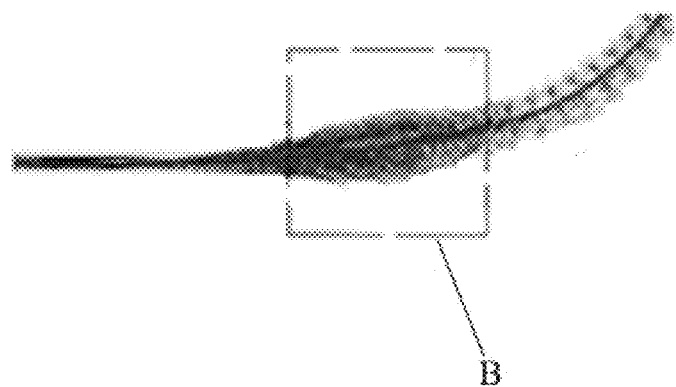
FIG. 3 is a simulation diagram for simulating stress concentration at B in FIG. 2 provided by some exemplary embodiments of the present disclosure.

Further, referring to the simulation diagram schematically shown in FIG. 3, the position B where the bending portion 12 is connected with the extension portion 13 is the position where stress is most concentrated. When the flexible display panel 1 is in the folded state, the wires in the bending portion 12 are easily damaged or disconnected after the bending portion 12 is pulled.

Figure 4:
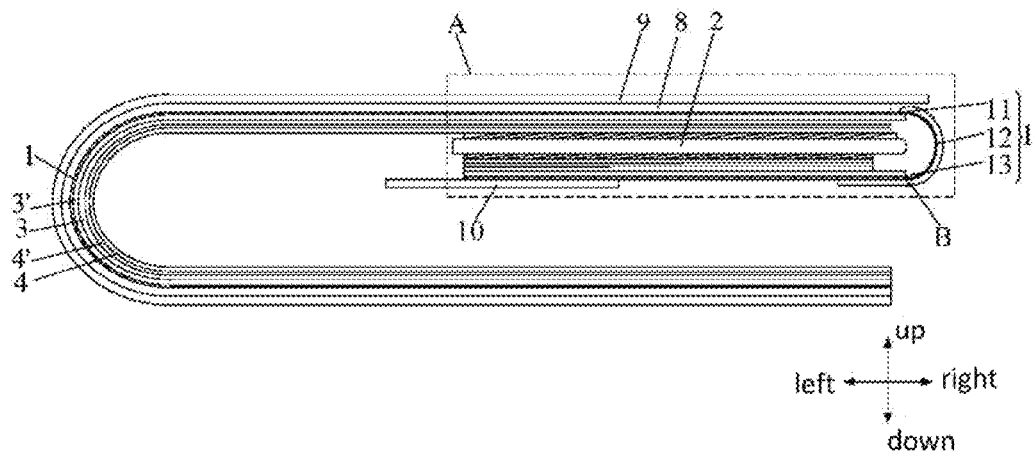
FIG. 4 is a schematic diagram of an overall structure of the flexible display device provided by other exemplary embodiments of the present disclosure.
Figure 5:
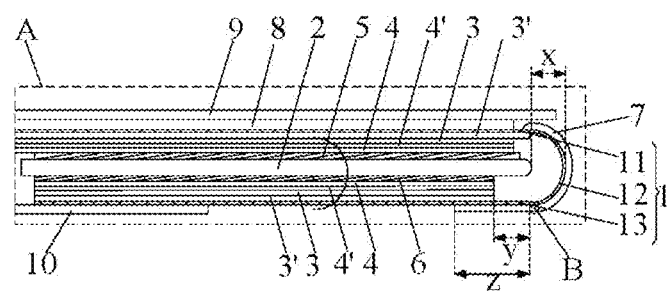
FIG. 5 is an enlarged view of part A in FIG. 4.
Figure 6:
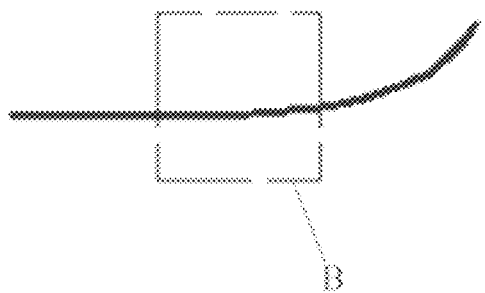
FIG. 6 is a simulation diagram for simulating stress situation at B in FIG. provided by some exemplary embodiments of the present disclosure.

FIG. 4 and FIG. 5 are schematic diagrams showing an overall structure of a flexible display device provided by other exemplary embodiments of the present disclosure. On the basis of the flexible display device illustrated in FIG. 1, the inventor of this disclosure has further discovered through hard work, continuous experiments and simulation studies that a distance y can be set between an end of a second connecting structure 6 close to the bending portion 12 and an end B of the bending portion 12 connecting the extension portion 13 in the extending direction parallel to the extension portion 13, which can further reduce the stress at the end B of the bending portion 12 connecting the extension portion 13 in the folded state.

Further research shows that the above-mentioned distance y can be 0.1 mm~2 mm, optionally 0.1 mm~1 mm, which can well relieve the stress at B, thus avoiding the risk of internal wire damage or disconnection in the bending portion 12.

After hard work, continuous experiments and simulation studies, the inventor of the present disclosure further found that if the curable adhesive 7 is coated at a side of the bending portion 12 facing away from the support member 2, and the curable adhesive has certain elasticity and softness, the bending portion 12 can be further prevented from being excessively deformed, and a certain degree of support and protection can be formed for the bending portion.

After hard work, continuous experiments and simulation studies, the inventor of the present disclosure further found that if the curable adhesive 7 extends beyond the bending portion 12 and at least partially covers the extension portion 13, the stress concentration at B can be further effectively relieved, and wire damage, short circuit or disconnection can be avoided.

Further, in the extending direction parallel to the extension portion, it is appropriate to set the length z of the curable adhesive 7 covering the extension portion 13 to be 0.3 mm~2 mm, so that the curable adhesive has a good protection effect on the bending portion 12 and solves the problem of stress concentration at B.

The inventor of this disclosure further found through hard work, continuous experiments and simulation studies that on the basis of the flexible display device illustrated in FIG. 1, if the end of the second connecting structure 6 connecting the support member 2 and the extension portion 13 close to the bending portion is spaced apart from the end point B by a distance y, and at the same time, a side of the bending portion 12 facing away from the support member 2 is coated with curable adhesive, and the curable adhesive covers the length z of the extension portion 13 in the extending direction parallel to the extension portion, the stress at B can be relieved more effectively. As can be seen from simulation diagram of the FIG. 6, the peak of the stress concentration is greatly reduced.

In the flexible display device provided by some exemplary embodiments of the present disclosure, the flexible display panel comprises an active area, a bending portion, and an extension portion, wherein the bending portion is bent so that the extension portion is located at a back surface of the active area, and a support area is formed between the active area, the extension portion, and the bending portion. A support member is in the support area. A preset safety distance is set between the support member and the bending portion. A certain distance is set between an end of the second connecting structure connecting the support member and the extension portion close to the bending portion and an end of the bending portion connecting the extension portion, and a side of the bending portion facing away from the support member is coated with curable adhesive, so that the bending portion can be well supported and protected in the folding process of the flexible display device, the stress at the stress concentration part is effectively relieved, and the problem of wire damage or disconnection in the bending portion is effectively avoided.

The flexible display device provided by some exemplary embodiments of the present disclosure further includes a touch layer 8 and a cover plate 9, wherein the touch layer 8 is bonded to a side of the active area 11 facing away from the support member 2, the touch layer 8 can be connected to the active area 11 through optical adhesive, the cover plate 9 is bonded to a side of the touch layer 8 facing away from the support member 2, and the cover plate 9 can be connected to the touch layer 8 through optical adhesive. When the cover plate 9 is pressed, the damage to the bending portion 12 can be effectively avoided, and the problem of wire damage caused by poking or wire disconnection in the bending portion can be alleviated.

Optionally, the flexible display device further includes a flexible printed circuit board (FPC)10, which is connected with a bottom surface of the extension portion 13.

It should be understood that although various features and benefits of the disclosure and specific details of the structure and function of the disclosure have been set forth in the above description, these contents are merely exemplary, and the specific details, especially the shape, size, number and arrangement of components, can be specifically changed within the scope of the principles of the disclosure to the overall scope represented by broad general meaning claimed by the claims of the disclosure.

Unless otherwise defined, all technical and scientific terms used in this disclosure have the same meanings as commonly understood by those skilled in the art to which this disclosure belongs.

Those skilled in the art will understand the term "substantially" herein (such as in "substantially all light" or in "consisting essentially of"). The term "substantially" may also include embodiments having "wholly", "completely", "all", etc. Therefore, in an embodiment, adjectives are also basically removable. Where applicable, the term "substantially" may also refer to 90% or higher, such as 95% or higher, especially 99% or higher, even more particularly 99.5% or higher, including 100%. The term "including" also includes embodiments in which the term "including" means "consisting of". The term "and/or" particularly relate to one or more of that items mentioned before and after "and/or". For example, the phrase "item 1 and/or item 2" and similar phrases may refer to one or more of item 1 and item 2. The term "comprising" may mean "consisting of" in one embodiment, but may also mean "including at least the defined species and optionally one or more other species" in another embodiment.

In addition, the terms first, second, third, etc. in this specification and in the claims are used to distinguish between similar elements and do not indicate any order, quantity or importance. It should be noted that these terms so used are interchangeable under appropriate circumstances, and that the embodiments of the disclosure described herein can operate in a different order from that described or shown herein.

"Upper", "lower", "left" and "right" are only used to express the relative positional relationship. When the absolute position of the described object changes, the relative positional relationship may change accordingly.

It should be noted that the above-mentioned embodiments illustrate rather than limit the disclosure, and those skilled in the art will be able to design many alternative embodiments without departing from the scope of the appended claims. In the claims, any reference marks placed between parentheses should not be interpreted as limiting the claims. The use of the verb "to include" and its morphological changes does not exclude the existence of elements or steps different from those stated in the claims. The word "a" or "an" in the claims of this disclosure does not exclude the plural, which is only for convenience of description and should not be understood as limiting the protection scope of this disclosure.

The present disclosure can be realized by means of hardware including several different elements, and by means of a suitably programmed computer. In a device claim enumerating several means, several of these means can be embodied by the same hardware item. The mere fact that certain measures are recited in mutually different dependent claims does not indicate that a combination of these measures cannot be used to advantage.

The present disclosure is further applicable to devices that include one or more of the characterizing features described in this specification and/or shown in the drawings. The present disclosure further relates to a method or process including one or more of the characterizing features described in this specification and/or shown in the drawings.

The various aspects discussed in this disclosure may be combined to provide additional advantages. In addition, those skilled in the art will understand that embodiments can be combined, and more than two embodiments can also be combined. In addition, some features may form the basis of one or more divisional applications.

The invention claimed is:

1. A flexible OLED display device, comprising:
  a flexible display panel comprising an active area, an extension portion and a bending portion connecting the active area and the extension portion;
  a support member positioned between the active area and the extension portion; and,
  a first laminated structure disposed between an upper surface of the support member and a lower surface of the active area, wherein the first laminated structure comprises a first film adhesive, a first film, a second film adhesive and a second film,
  wherein the active area, the support member and the extension portion are stacked, and a first distance is set between the support member and the bending portion in an extending direction parallel to the extension portion,
  wherein the bending portion is substantially of a semicircular shape, and an inner radius of the semicircular shape is equal to a sum of a half of a thickness of the support member and a thickness of the first laminated structure,
  wherein the first distance is determined by the following relationship:

$$x \geq (T_{bond}^2 + T_{oled}^2 + T_{support\ member}^2)^{1/2} + \Delta;$$

wherein x is the first distance; $T_{bond}$ is a bond tolerance between the flexible display panel and the support member in the extending direction parallel to the extension portion; $T_{oled}$ is a dimensional tolerance of the flexible display panel in the extending direction parallel to the extension portion, and $T_{support\ member}$ is a dimensional tolerance of the support member in the extending direction parallel to the extension portion; $\Delta$ is an amount of misalignment of the support member relative to the flexible display panel in the extending direction parallel to the extension portion when the flexible display panel is folded, wherin $\Delta \approx \pi(1/2*t_{oled}+t_{first\ film\ adhesive}+t_{first\ film}+t_{second\ film\ adhesive}1/2*t_{second\ film})*K$, where toled represents a thickness of the flexible display panel, $t_{first\ film\ adhesive}$ represents a thickness of the first film adhesive, $t_{second\ film\ adhesive}$ represents a thickness of the second film adhesive, $t_{first\ film}$ represents a thickness of the first film, $t_{second\ film}$ represents a thickness of the second film, K is a coefficient which is 1~2.5.

2. The flexible OLED display device according to claim 1, wherein the first distance is 0.2 mm~1 mm.

3. The flexible OLED display device according to claim 1, further comprising a second laminated structure, wherein the first laminated structure is configured to adhere a first surface of the support member with the active area, the second laminated structure is configured to adhere a second surface of the support member with the extension portion, and the first surface of the support member is opposite to the second surface.

4. The flexible OLED display device according to claim 3, wherein the first laminated structure further comprises:
a first connecting structure arranged at a side of the support member facing the active area;
wherein the first film is bonded to a side of the flexible display panel facing the support member and terminates at the bending portion;
wherein the second film is bonded to a side of the first film facing the support member and terminates at the bending portion.

5. The flexible OLED display device according to claim 4, wherein the second laminated structure comprises:
a first film which is bonded to a side of the flexible display panel facing the support member and terminates at the bending portion;
a second film, which is bonded to a side of the first film facing the support member and terminates at the bending portion; and
a second connecting structure arranged at a side of the support member facing the extension portion, wherein the support member is bonded and connected with the second film of the first laminated structure and the second film of the second laminated structure through the first connecting structure and the second connecting structure respectively.

6. The flexible OLED display device according to claim 5, wherein a distance y is set between an end of the second connecting structure close to the bending portion and an end of the bending portion connecting the extension portion in the extending direction parallel to the extension portion.

7. The flexible OLED display device according to claim 6, wherein the distance y is 0.1 mm~2 mm.

8. The flexible OLED display device according to claim 5, wherein,
the first connecting structure and the second connecting structure are both double-sided adhesive tapes;
the first film comprises any one of the following: a double-sided adhesive tape, polyimide, polyester resin or a metal film;
the second film comprises any one of the following: a double-sided adhesive tape, polyimide, polyester resin or a metal film;
a material of the support member comprises any one of following materials: plastic, nylon glass fiber, stainless steel, aluminum alloy, copper alloy, titanium alloy, rubber or foam.

9. The flexible OLED display device according to claim 5, wherein the first film in the first laminated structure is connected with the flexible display panel by a first film adhesive, and the second film in the first laminated structure is connected with the first film in the first laminated structure by a second film adhesive.

10. The flexible OLED display device according to claim 9, wherein the first connecting structure and the second connecting structure are both double-sided adhesive tapes, and an adhesive strength of the first connecting structure is greater than that of the first film adhesive and also greater than that of the second film adhesive.

11. The flexible OLED display device according to claim 1, wherein a side of the bending portion facing away from the support member is coated with a curable adhesive.

12. The flexible OLED display device according to claim 11, wherein the curable adhesive exceeds the bending portion and at least partially covers the extension portion.

13. The flexible OLED display device according to claim 12, wherein in the extending direction parallel to the extension portion, a length of the extension portion coated with the curable adhesive is 0.3 mm~2 mm.

* * * * *